United States Patent [19]

Hamuro et al.

[11] Patent Number: 4,633,370
[45] Date of Patent: Dec. 30, 1986

[54] CHIP-LIKE ELECTRONIC COMPONENT SERIES

[75] Inventors: Mitsuro Hamuro; Kimiharu Anao; Keiichi Shimamaki, all of Nagaokakyo, Japan

[73] Assignee: Murata Manufacturing Co., Ltd., Japan

[21] Appl. No.: 707,581

[22] Filed: Mar. 4, 1985

[30] Foreign Application Priority Data

Mar. 5, 1984 [JP] Japan .............................. 59-31790[U]

[51] Int. Cl.⁴ ............................................. B65D 75/24
[52] U.S. Cl. ...................................... 361/380; 206/330
[58] Field of Search .............. 361/380, 398, 419, 420; 206/329, 330, 332, 384, 460, 632, 328, 499

[56] References Cited

U.S. PATENT DOCUMENTS 3,444,993 5/1969 Lunsford .............................. 206/330
4,298,120 11/1981 Kaneko et al. ...................... 206/329

Primary Examiner—A. D. Pellinen
Assistant Examiner—Morris Ginsburg
Attorney, Agent, or Firm—Ostrolenk, Faber, Gerb & Soffen

[57] ABSTRACT

A chip-like electronic component series retains a plurality of chip-like electronic components (2) distributed along a longitudinal direction of a tape (1). The tape (1) is formed with a plurality of cavities (5) distributed in its longitudinal direction, so that the chip-like electronic components are received in respective ones of the cavities. In order to retain the chip-like electronic components in the cavities, the cavities are covered by a cover sheet (3). Each of the cavities comprises a relatively flat receiving portion (7) having a bottom surface (6) extending along the longitudinal direction of the tape and a projecting receiving portion (8) projecting from a part of the bottom surface of the flat receiving portion. With such configuration, the cavities can retain at least two types of chip-like electronic components of different geometry or retain the chip-like electronic components at least in two types of conditions.

16 Claims, 9 Drawing Figures

CHIP-LIKE ELECTRONIC COMPONENT SERIES

BACKGROUND OF THE INVENTION

The present invention relates to a chip-like electronic component series retaining chip-like electronic components which are to be distributed by a tape along the longitudinal direction of the tape.

A chip-like electronic component series enables efficient supply of chip-like electronic components retained therein, to be mounted on a printed circuit board or the like. A tape is fed along its longitudinal direction so that the chip-like electronic components distributed along the tape are successively transferred therewith, whereby the respective chip-like electronic components are brought to prescribed positions. Therefore, the chip-like electronic components can efficiently be taken out from the prescribed positions to be supplied to predetermined positions of the print circuit board etc.

A chip-like electronic component series according to the prior art of interest for the present invention is disclosed in U.S. Pat. No. 4,298,120 issued on Nov. 3, 1981, granted to Kaneko et al. The patent discloses a tape formed with a plurality of cavities distributed in the longitudinal direction for receiving chip-like electronic components in respective ones of the said cavities, which are covered by cover means for retaining the electronic components in the cavities.

In such a conventional chip-like electronic component series, the geometry of the cavities formed in the tape is determined by that of the chip-like electronic components to be retained therein and desired retaining conditions thereof, whereby the electronic components are substantially prevented from being loose in the cavities. Further, a step of inserting the chip-like electronic components respectively in a plurality of cavities formed in the tape is generally performed by utilizing an automatic apparatus in which a desired tape is set to be fed for bringing the cavities to prescribed positions, thereby to insert the chip-like electronic components in the cavities.

However, in the aforementioned conventional chip-like electronic component series, the cavities are formed in conformity with the chip-like electronic components to be received therein, and hence exclusive tapes are required respectively for various types of electronic components. Thus, it is necessary to prepare various types of tapes in a corresponding number to the types of the chip-like electronic components to be in series. Even in case of electronic components of the same type, tapes having different-shaped cavities must be prepared when the electronic components are to be retained in different positions. Such increase in the number of types of tapes to be prepared prevents the cost reductions that would be expected to flow from mass production of the tapes. Further, manufacturers of the chip-like electronic components are usually required to store various types of tapes for quickly supplying demands of the users, and hence management of warehouses is complicated by the aforementioned disadvantage. In addition, when the types of the electronic components and retaining conditions or positions thereof in the tape are changed in a step for inserting the chip-like electronic components in the cavities of the tape by the automatic apparatus, the tape theretofore set in the apparatus must be replaced by a new appropriate tape. Such replacement of the tape decreases efficiency in operation for manufacturing the chip-like electronic component series.

SUMMARY OF THE INVENTION

Accordingly, an object of the present invention is to provide a chip-like electronic component series in which cavities formed in a tape are provided in shapes applicable to at least two types of chip-like electronic components of different geometry, or in shapes which can implement at least two types of conditions or positions for retaining chip-like electronic components of identical geometry.

The chip-like electronic component series according to the present invention includes a tape extending in its longitudinal direction and a plurality of cavities formed therein to be distributed in the said longitudinal direction along the tape. The cavities are adapted to receive chip-like electronic components in respective ones of said cavities. A cover means is provided to cover the cavities for retaining the respective chip-like electronic components within the cavities. In the chip-like electronic component series of the above structure, each of the cavities comprises a relatively flat receiving portion having an opening end portion along the surface of the tape and a bottom surface extending along the longitudinal direction of the tape and at least one projecting receiving portion projecting from a part of the bottom surface of said flat receiving portion.

According to the present invention, certain types of chip-like electronic components can be retained in the flat receiving portions of the cavities. In this case, provision of the projecting receiving portions will not exert any influence on stability of the electronic components retained in the flat receiving portions. Further, chip-like electronic components of different geometry can be retained in the cavities utilizing both of the flat and projecting receiving portions. In this case, a plurality of retaining conditions can be employed in response to the geometry of the chip-like electronic components to be retained. For example, the chip-like electronic components can be retained in the cavities to occupy substantially the whole spaces of the projecting receiving portions and parts of the flat receiving portions, or to occupy substantially the whole spaces of the flat receiving portions and at least parts of the projecting receiving portions. Further, chip-like electronic components of the same type can be retained only in the flat receiving portions or substantially in the whole spaces of the projecting receiving portions and parts of the flat receiving portions.

Thus, a tape of one type can be used to retain components in at least two conditions. Consequently, the types of the tapes to be prepared are decreased, leading to reduction of cost by mass production of the tapes and reduction of complexity in management of warehouses. Further, even if the geometry of the chip-like electronic components included in the series to be manufactured or the retaining condition thereof in the tape is changed, the step of inserting the chip-like electronic components in the cavities may be performed while keeping the same tape set in an automatic apparatus.

The above and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
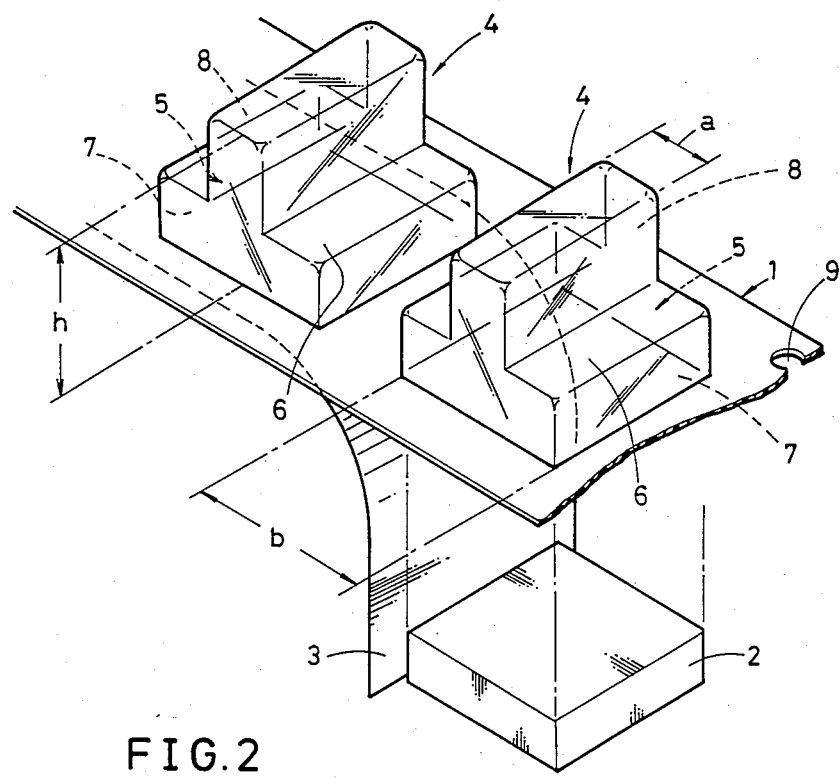
FIG. 1 is a partially exploded perspective view showing an embodiment of the present invention.
Figure 2:
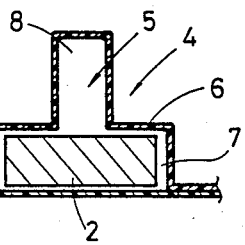
FIGS. 2 to 4 are sectional views showing various states for retaining chip-like electronic components in cavities provided in a tape as shown in FIG. 1.
Figure 3:
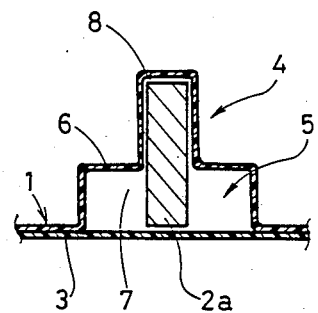
Figure 4:
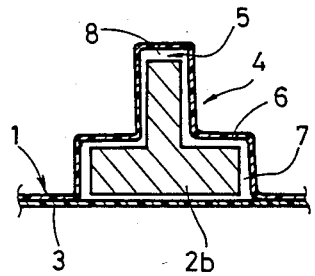

Referring to FIG. 1, a chip-like electronic component series comprises a tape 1, a plurality of chip-like electronic components 2 and a cover sheet 3. The tape 1 is formed by, e.g., a transparent sheet of thermoplastic synthetic resin. The tape 1 is formed on one surface thereof with a plurality of projections 4 by embossing with application of heat. Although only two projections 4 are shown in FIG. 1, such projections 4 are further distributed along the longitudinal direction of the tape 1. These projections 4 are formed to define cavities 5 in the lower side of the tape 1 as shown in FIG. 1. The sectional shapes of the projections 4, i.e., those of the cavities 5 are shown in FIGS. 2 to 4. In other words, each of the cavities 5 has an inverted T-shaped cross section. Each cavity 5 having such a sectional shape comprises a relatively flat receiving portion 7 having an opening end portion along the surface of the tape 1 and a bottom surface 6 extending along the longitudinal direction of the tape 1 and a projecting receiving portion 8 projecting from a part of the bottom surface 6 of the flat receiving portion 7. Especially in the present embodiment, the projecting receiving portion 8 extends across the bottom surface 6 of the flat receiving portion 7 to divide the same in two, so that the projecting receiving portion 8 extends perpendicularly to the longitudinal direction of the tape 1 while being directed to the direction in which the bottom surface 6 extends. Referring again to FIG. 1, the width a of the projecting receiving portion 8 is shorter than the size b of the flat receiving portion 7 measured along the longitudinal direction of the tape 1, which size b of the flat receiving portion 7 is arranged to be different from the height h of the upper end portion of the projecting receiving portion 8. Instead, the size b may be the same as the height h.

The tape 1 has a plurality of feeding perforations which are distributed at regular intervals along the longitudinal direction thereof. It is to be noted that only one feeding perforation 9 is shown in FIG. 1 since other feeding perforations 9 are in the rearward of the projections 4.

The chip-like electronic component 2 is shown in FIG. 1. The chip-like electronic component 2 may be selected from various electronic components such as a capacitor and a resistor. Further, such capacitor or resistor may be of a fixed or variable type to be employed as the chip-like electronic component 2. Although, in this regard, the electronic component 2 is shown in the form of a rectangular parallelepiped in FIG. 1, the same may be provided in a columnar form or other, various forms. Throughout the specification and claims "chip-like electronic component" is intended to include those having electric connecting terminals directly formed on the surfaces of the chips and those comprising terminals slightly projecting from the chips.

The cover sheet 3 is formed by, e.g., a transparent sheet of thermoplastic synthetic resin. The cover sheet 3 is adhered to the lower surface of the tape 1 in FIG. 1 to cover openings of the cavities 5. More specifically, the cover sheet 3 is adhered to the tape 1 by heating both side edges thereof in view of the fact that at least one of the tape 1 and the cover sheet 3 is formed by thermoplastic resin.

It is to be noted that the electronic component series in FIG. 1 is shown in a condition for ready understanding of the invention, and is handled in a condition turned upside down from that shown in FIG. 1 in practice. Therefore, each chip-like electronic component 2 is inserted in the respective cavity 5 downwardly from above, and the chip-like electronic component 2 retained in the cavity 5 is upwardly taken out from the same.

FIG. 2 illustrates a state of the chip-like electronic component 2 of FIG. 1 received in the cavity 5. The chip-like electronic component 2 is so placed in the cavity 5 as to occupy substantially the whole space of the flat receiving portion 7. Another chip-like electronic component 2a, which is substantially identical in geometry to the chip-like electronic component 2, may be so placed in the cavity 5 as to occupy substantially the whole space of the projecting receiving portion 8 and a part of the flat receiving portion 7 as shown in FIG. 3. It is a matter of course that the chip-like electronic component 2a can be retained in the flat receiving portion 7 similarly to the chip-like electronic component 2 as shown in FIG. 2.

FIG. 4 shows a chip-like electronic component 2b having a projecting portion such as a rotary shaft provided in a variable capacitor or a variable resistor. The chip-like electronic component 2b having such configuration is arranged to occupy the spaces of both of the flat receiving portion 7 and the projecting receiving portion 8 with its projecting portion being positioned in the projecting receiving portion 8.

As shown in FIGS. 2 to 4, each of the chip-like electronic components 2, 2a and 2b can be retained in the cavity 5 substantially with no looseness. Further, such retaining conditions of the chip-like electronic components can be readily visually recognized from the outside when at least one of the tape 1 and the cover sheet 3 is transparent as hereinabove described.

FIGS. 5 to 8 respectively show other embodiments relating to formation of projecting receiving portions of cavities formed in tapes. It is to be noted that chip-like electronic components are not shown in FIGS. 5 to 8.

Figure 5:
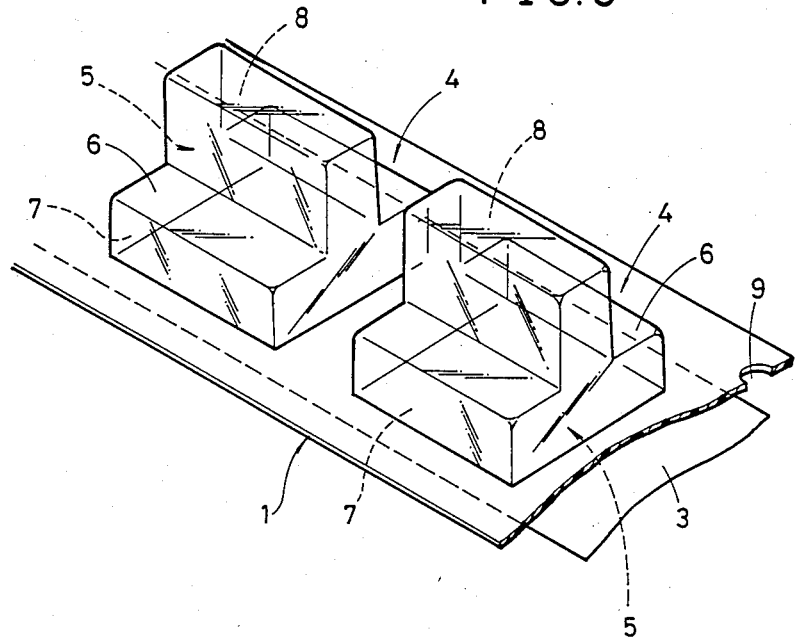
FIG. 5 is a perspective view showing another embodiment of the present invention.

In the embodiment as shown in FIG. 5, each of projecting receiving portions 8 extends in parallel with the longitudinal direction of a tape 1.

Figure 6:
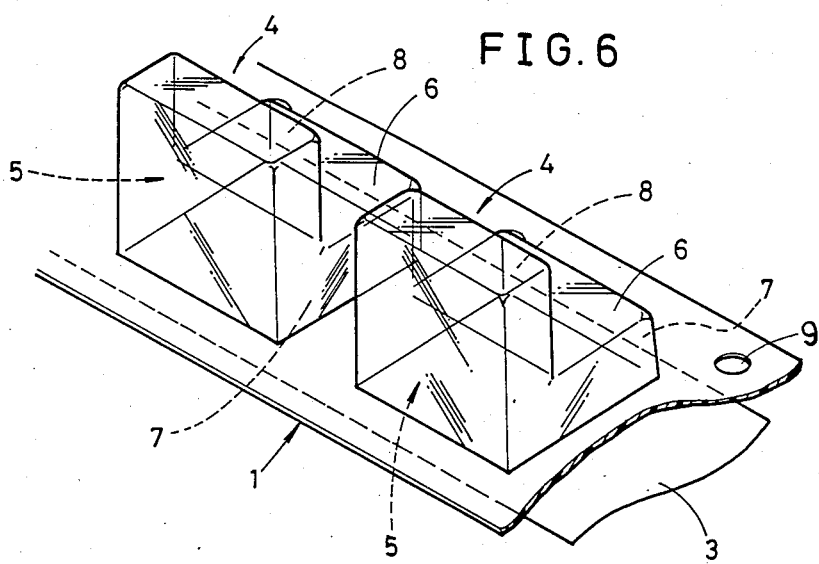
FIG. 6 is a perspective view showing a further embodiment of the present invention.

In the embodiment as shown in FIG. 6, the longitudinal direction of each of projecting receiving portions 8 is directed in parallel with that of a tape 1, while being arranged to extend along the side edge of a bottom surface 6 of each of flat receiving portions 7.

Figure 7:
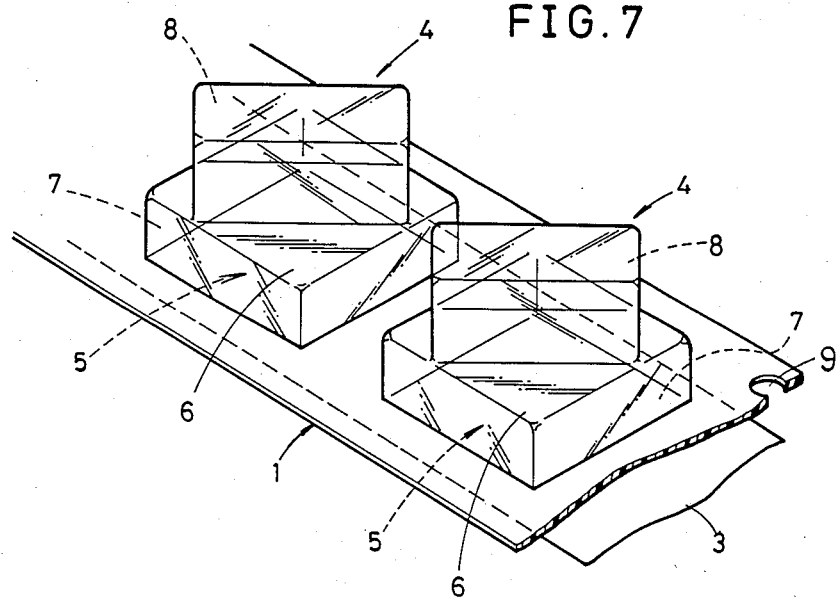
FIG. 7 is a perspective view showing a still further embodiment of the present invention.

In the embodiment as shown in FIG. 7, projecting receiving portions 8 are directed obliquely against the longitudinal direction of a tape 1.

Figure 8:
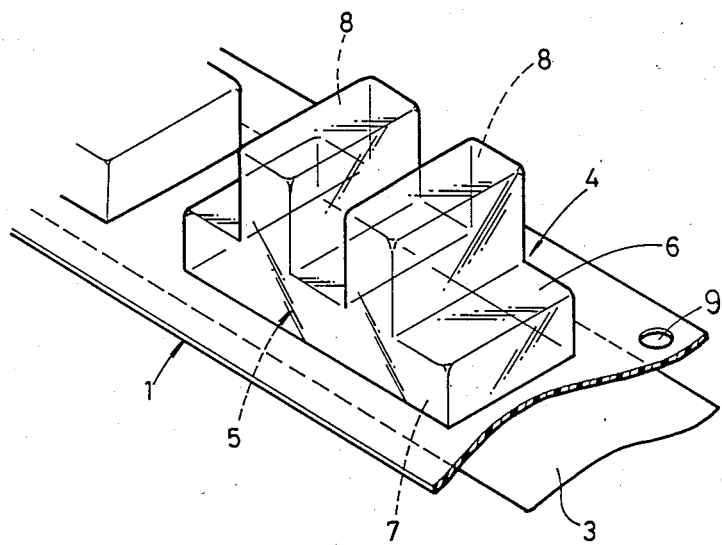
FIG. 8 is a perspective view showing a still further embodiment of the present invention.

In the embodiment as shown in FIG. 8, each of cavities 5 has a relatively long size extending along the longitudinal direction of a tape 1. Further, two projecting receiving portions 8 are provided in parallel with each other with respect to one flat receiving portion 7. The cavity 5 having such configuration can retain a relatively lengthened chip-like electronic component or two chip-like electronic components.

In relation to the embodiment as shown in FIG. 8, a further number of projecting receiving portions 8 may be provided with respect to one flat receiving portion 7.

Figure 9:
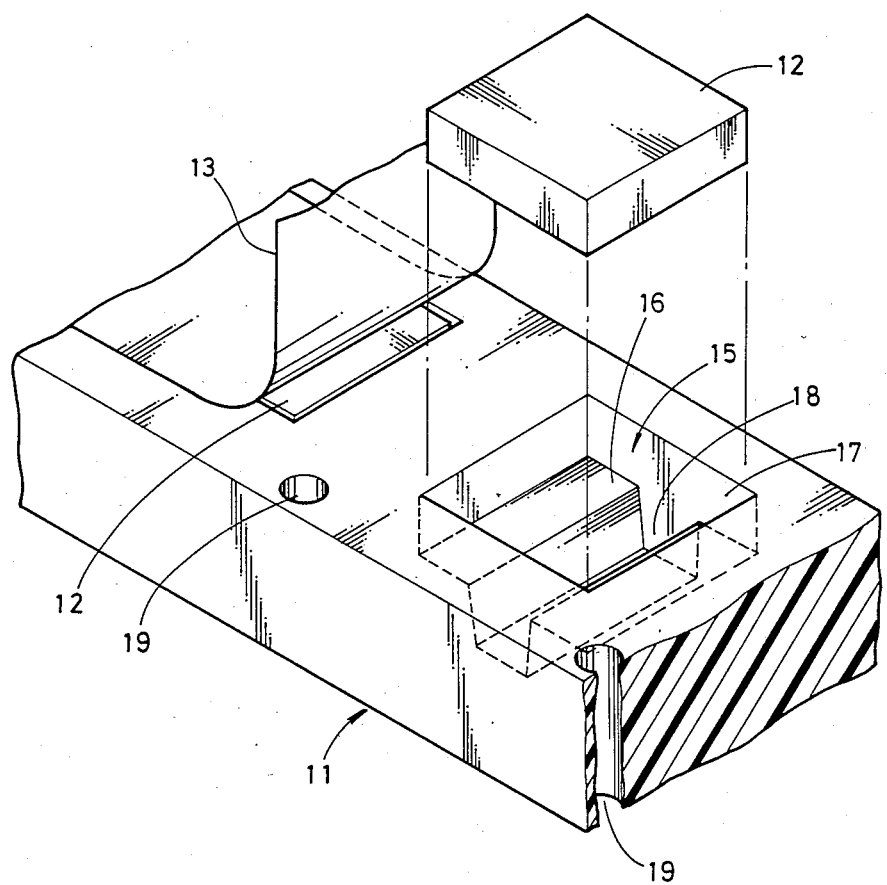
FIG. 9 is a partially exploded perspective view showing a still further embodiment of the present invention.

In each of the aforementioned embodiments, the tape 1 is formed by a relatively thin sheet material. However, a relatively thick tape 11 is employed in a further embodiment as shown in FIG. 9. The tape 11 is made of flexible thermoplastic synthetic resin, with cavities 15 formed by molding. Each of the cavities 15 comprises a relatively flat receiving portion 17 and a projecting receiving portion 18 projecting from a part of a bottom surface 16 of the flat receiving portion 17 similarly to the respective embodiments as hereinabove described. The flat receiving portion 17 and the projecting receiving portion 18 extend within the range of the thickness of the tape 11. The numeral 19 denotes a feeding perforation.

A chip-like electronic component 12 as shown in FIG. 9 is inserted in the cavity 15 to occupy, e.g., only the flat receiving portion 17. The cavity 15 can, needless to say, retain other chip-like electronic component of different geometry or retain the same in a different retaining condition.

A cover sheet 13 is made of, e.g., thermoplastic synthetic resin and adhered to the tape 11 by heating.

Each of the chip-like electronic component series disclosed by the aforementioned embodiments is preferably structured to be flexible with respect to the longitudinal direction of the tape 1 or 11. This is because a flexible chip-like electronic component series can be readily rolled in a roll shape. Such rolled state of the chip-like electronic component series facilitates shipment thereof as well as facilitating loading of the tape or the chip-like electronic component series in devices for positioning and withdrawing the chip-like electronic components.

Within the scope of the present invention, the cavities formed in the tape may be arbitrarily changed in geometry. Although, for example, the flat receiving portions are provided in the quadrilateral shape in plan view, other shapes such as square and circular shapes may be employed if desired. Further, the projecting receiving portions may also be formed in a desired shape. Although each of the projecting receiving portions is selected to be in a size extending across the entire bottom surface of the flat receiving portion, a shorter size may be employed.

In addition, the tape and the cover sheet may be formed by any desired materials. Therefore, the cover sheet may be adhered to the tape by a method utilizing an adhesive agent, other than adhesion by heating.

Although the present invention has been described and illustrated in detail, it is clearly understood that the same is by way of illustration and example only and is not to be taken by way of limitation, the scope of the present invention being limited only by the terms of the appended claims.

What is claimed is:

1. A chip-like electronic component series comprising:

a tape (1, 11) extending in a longitudinal direction and having a plurality of cavities (5, 15) formed therein and distributed along said tape in said longitudinal direction;

a plurality of chip-like electronic components (2, 2a, 2b, 12) received in respective ones of said cavities; and cover means (3, 13) for covering said cavities to retain said electronic components therein, each of said cavities being configured for selectively accommodating said components in a plurality of orientations within said cavity;

each of said cavities further comprising a relatively flat receiving portion (7, 17) being defined by an opening end portion extending along the surface of said tape, a side surface extending away from the opening end portion of said cavity and having a first height as measured in a direction away from said tape, a bottom surface (6, 16) extending from said side surface and along said tape in said longitudinal direction, and at least one projecting receiving portion (8, 18) projecting from a part of said bottom surface of said flat receiving portion, and having a second height which is greater than said first height.

2. A chip-like electronic component series in accordance with claim 1, wherein said tape is flexible.

3. A chip-like electronic component series in accordance with claim 1, wherein said projecting receiving portion extends generally parallel with respect to said bottom surface of said flat receiving portion.

4. A chip-like electronic component series in accordance with claim 3, wherein said projecting receiving portion has a longitudinal direction which is generally parallel to the direction in which said bottom surface extends.

5. A chip-like electronic component series in accordance with claim 4, wherein said longitudinal direction of said projecting receiving portion is directed perpendicularly to said longitudinal direction of said tape.

6. A chip-like electronic component series in accordance with claim 4, wherein said longitudinal direction of said projecting receiving portion is directed in parallel with said longitudinal direction of said tape.

7. A chip-like electronic component series in accordance with claim 4, wherein said longitudinal direction of said projecting receiving portion is directed obliquely to said longitudinal direction of said tape.

8. A chip-like electronic component series in accordance with claim 4, wherein said projecting receiving portion extends to divide said bottom surface of said flat receiving portion in two.

9. A chip-like electronic component series in accordance with claim 4, wherein said projecting receiving portion extends from said side surface of said cavity.

10. A chip-like electronic component series in accordance with claim 4, further comprising a second projecting receiving portion projecting from said bottom surface and having a longitudinal direction which is generally parallel to the longitudinal direction of the first-mentioned projecting receiving portion.

11. A chip-like electronic component series in accordance with claim 1, wherein said tape (1) includes a sheet material, said flat receiving portion (7) and said projecting receiving portion (8) being formed by embossing said sheet material.

12. A chip-like electronic component series in accordance with claim 1, wherein said tape (11) has a thickness as measured in a direction perpendicular to said longitudinal direction, said flat receiving portion (17) and said projecting receiving portion (18) extending within the range of said thickness of said tape.

13. A chip-like electronic component series in accordance with claim 1, wherein said cover means is adhered to said tape.

14. A chip-like electronic component series in accordance with claim 13, wherein at least one of said tape and said cover means includes thermoplastic resin, said cover means being adhered to said tape by heating.

15. A chip-like electronic component series in accordance with claim 1, wherein said tape has a plurality of feeding perforations (9, 19).

16. A chip-like electronic component series in accordance with claim 1, wherein said tape is transparent.

* * * * *